United States Patent
Kim et al.

(10) Patent No.: US 9,118,299 B2
(45) Date of Patent: Aug. 25, 2015

(54) PIEZOELECTRIC VIBRATION MODULE

(71) Applicant: SAMSUNG ELECTRO-MECHANICS CO., LTD., Gyunggi-do (KR)

(72) Inventors: Jae Kyung Kim, Gyunggi-do (KR); Dong Sun Park, Gyunggi-do (KR); Joon Choi, Gyunggi-do (KR); Yeon Ho Son, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 350 days.

(21) Appl. No.: 13/664,524

(22) Filed: Oct. 31, 2012

(65) Prior Publication Data
US 2013/0300256 A1  Nov. 14, 2013

(30) Foreign Application Priority Data
May 8, 2012 (KR) .................. 10-2012-0048711

(51) Int. Cl.
*H01L 41/053* (2006.01)
*H01L 41/09* (2006.01)
*H03H 9/09* (2006.01)
*H03H 9/10* (2006.01)

(52) U.S. Cl.
CPC ............... *H03H 9/09* (2013.01); *H01L 41/053* (2013.01); *H03H 9/1007* (2013.01)

(58) Field of Classification Search
CPC ........................ H01L 41/0933; H01L 41/053
USPC ......... 310/326, 328–332, 348, 344, 345, 351, 310/353
See application file for complete search history.

(56) References Cited

U.S. PATENT DOCUMENTS 6,140,745 A * 10/2000 Bryant .................. 310/353

FOREIGN PATENT DOCUMENTS

| JP | 61-30975 | 2/1986 |
|---|---|---|
| JP | H2-94486 | 1/1989 |
| JP | 7-235853 | 9/1995 |
| JP | 9-225401 | 9/1997 |
| JP | 10-117472 | 5/1998 |
| JP | 2000-140759 | 5/2000 |
| JP | 2001-104880 | 4/2001 |
| JP | 2006-86790 | 3/2006 |
| KR | 2011-0045486 | 5/2011 |
| KR | 1080641 | 11/2011 |

OTHER PUBLICATIONS

Office action dated Apr. 30, 2013 from corresponding Korean Patent Application No. 10-2012-0048711 and its English summary provided by the clients.
Office action dated Nov. 11, 2013 from corresponding Korean Patent Application No. 10-2012-0048711 and its English summary provided by the clients.
Office action dated Apr. 8, 2014 from corresponding Japanese Patent Application No. 2013-098907 and its English summary provided by the applicants.

* cited by examiner

*Primary Examiner* — Derek Rosenau
(74) *Attorney, Agent, or Firm* — Ladas & Parry, LLP

(57) ABSTRACT

Disclosed herein is a piezoelectric vibration module that includes a side damper between a vibration plate with a piezoelectric element and an upper case so as to ensure reliability against external shock applied to the side and narrows a spaced distance between the vibration plate and the upper case.

15 Claims, 4 Drawing Sheets

PIEZOELECTRIC VIBRATION MODULE

CROSS REFERENCE TO RELATED APPLICATION

This application claims the benefit of Korean Patent Application No. 10-2012-0048711, filed on May 8, 2012, entitled "Piezoe Vibration Module", which is hereby incorporated by reference in its entirety into this application.

BACKGROUND OF THE INVENTION

1. Technical Field

The present invention relates to a piezoelectric vibration module.

2. Description of the Related Art

In general, in portable electronic apparatuses such as a cellular phone, an electronic book (E-book) terminal, a game machine, a PMP, and the like, a vibration function is used for various purposes.

In particular, a vibration generator for generating vibration is primarily mounted on the portable electronic apparatuses to be used as a warning function which is a silent receiving signal.

Due to implementation of multi-functions of the portable electronic apparatuses, the vibration generator actually requires miniaturization, integration, and various high-functionality at present.

Furthermore, a touch type device has been generally adopted, which performs an input operation by touching the portable electronic apparatus according to a user's request to intend to conveniently use the portable electronic apparatus.

A haptic device which is currently in common use widely includes even a concept of reflecting interface user's intuitive experience and further diversifying a feedback for a touch in addition to a concept of performing an input operation through the touch.

The haptic device generally provides vibration through repeated extension and/or shrinkage as external power is applied to a piezoelectric element. The piezoelectric element can improve moisture-resistance and durability as disclosed in an ultrasonic linear motor of Patent Document 1.

In the ultrasonic linear motor according to Patent Document 1, a protection material, for example, silicon rubber surrounds the circumference of the piezoelectric element to prevent collision with a plurality of constituent members constituting the ultrasonic linear motor so as to improve the life-span thereof as well as the performance of the piezoelectric element under an environment with high humidity or an environment with lots of dust.

However, the ultrasonic linear motor according to Patent Document 1 surrounds the rest of the parts other than a part of the piezoelectric element generating vibration force through translation movement, and as a result, extension or shrinkage deformation rate is remarkably reduced.

That is, the protection material in the related art may still cause the vibration force of the piezoelectric element from deteriorating. Therefore, another measure for protecting the piezoelectric element from external factors should be taken.

PRIOR ART DOCUMENT

Patent Document (Patent Document 1) Patent Document 1: Japanese U. M. Laid-Open Publication No. Hei 2-94486

SUMMARY OF THE INVENTION

The present invention has been made in an effort to provide a piezoelectric vibration module that can protect a piezoelectric element of a vibration plate from external shock, in particular, a horizontal collision.

According to a first preferred embodiment of the present invention, there is provided a piezoelectric vibration module, including: a piezoelectric element generating vibration force through repetition of extension and shrinkage deformation by applying external power; an upper case having a bottom surface opened and an inner space formed therein so that the vibration plate vibrates linearly, and a damper protruding toward the center on the inner surface is provided; a lower case coupled to the bottom surface of the upper case and shielding the inner space of the upper case; and a vibration plate including the piezoelectric element on a flat lower plate and placed in the upper case and the lower case and driven vertically.

The vibration plate may include: the lower plate; a pair of upper plates that stand vertically upward at the centers of both sides of the lower plate; and a weight body placed between the pair of upper plates in order to increase the vibration force of the piezoelectric element.

The damper may be installed at the same height as the vibration plate and may be installed at the same height as the upper plate.

The length of the vibration plate may extend shorter than a spaced distance between two dampers, such that the vibration plate and the damper do not directly contact each other. A spaced distance between the damper and both ends of the vibration plate may be 1 mm or less.

The damper may be made of the same material as the upper case.

The damper may be made of a rigid material.

According to a second preferred embodiment of the present invention, there is provided a piezoelectric vibration module, including: a piezoelectric element generating vibration force through repetition of extension and shrinkage deformation by applying external power; an upper case having a bottom surface opened and an inner space formed therein so that a vibration plate vibrates linearly; a lower case coupled to the bottom surface of the upper case and shielding the inner space of the upper case; and a vibration plate including the piezoelectric element mounted on one surface thereof and dampers at both ends thereof and placed in the upper case and the lower case and driven vertically.

The vibration plate may include: the lower plate mounted with the piezoelectric element; a pair of upper plates that stand vertically upward at the centers of both sides of the lower plate; and a weight body placed between the pair of upper plates in order to increase the vibration force of the piezoelectric element.

An internal length of the upper case may be larger than the length of the vibration plate, such that the vibration plate with the dampers at both ends thereof does not directly contact an inner surface of the upper case. A spaced distance between the damper and the inner surface of the upper case may be 1 mm or less.

The damper may be made of the same material as the vibration plate.

The damper may be made of a rigid material.

According to a third preferred embodiment of the present invention, there is provided a piezoelectric vibration module, including: a piezoelectric element generating vibration force through repetition of extension and shrinkage deformation by applying external power; an upper case having a bottom surface opened and an inner space formed therein so that the piezoelectric element vibrates linearly; a lower case coupled to the bottom surface of the upper case and shielding the inner space of the upper case; and a vibration plate including a lower plate fixed on the lower case and mounted with the piezoelectric element and a pair of upper plates that stand vertically upward at the centers of both sides of the lower plate, and both ends of the upper plate extends so as not to contact an inner surface of the upper case.

A spaced distance between both ends of the upper plate and the inner surface of the upper case may be 1 mm or less.

The vibration plate may further include a weight body provided between the pair of upper plates.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
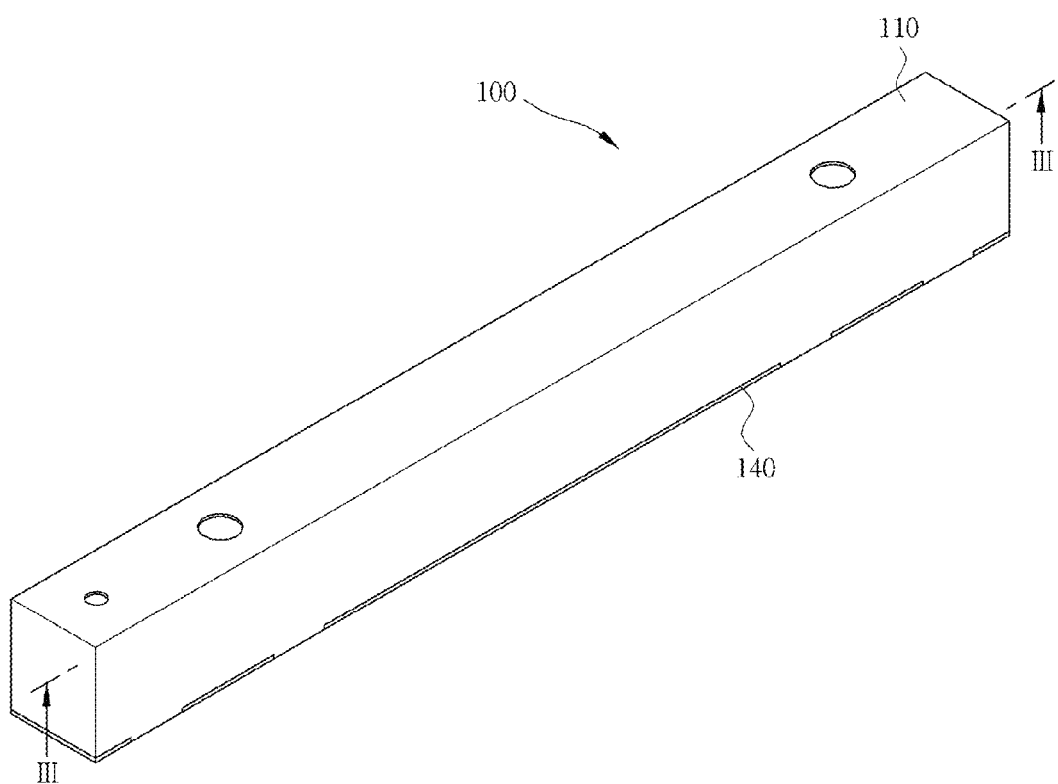
FIG. 1 is a perspective view of a piezoelectric vibration module according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
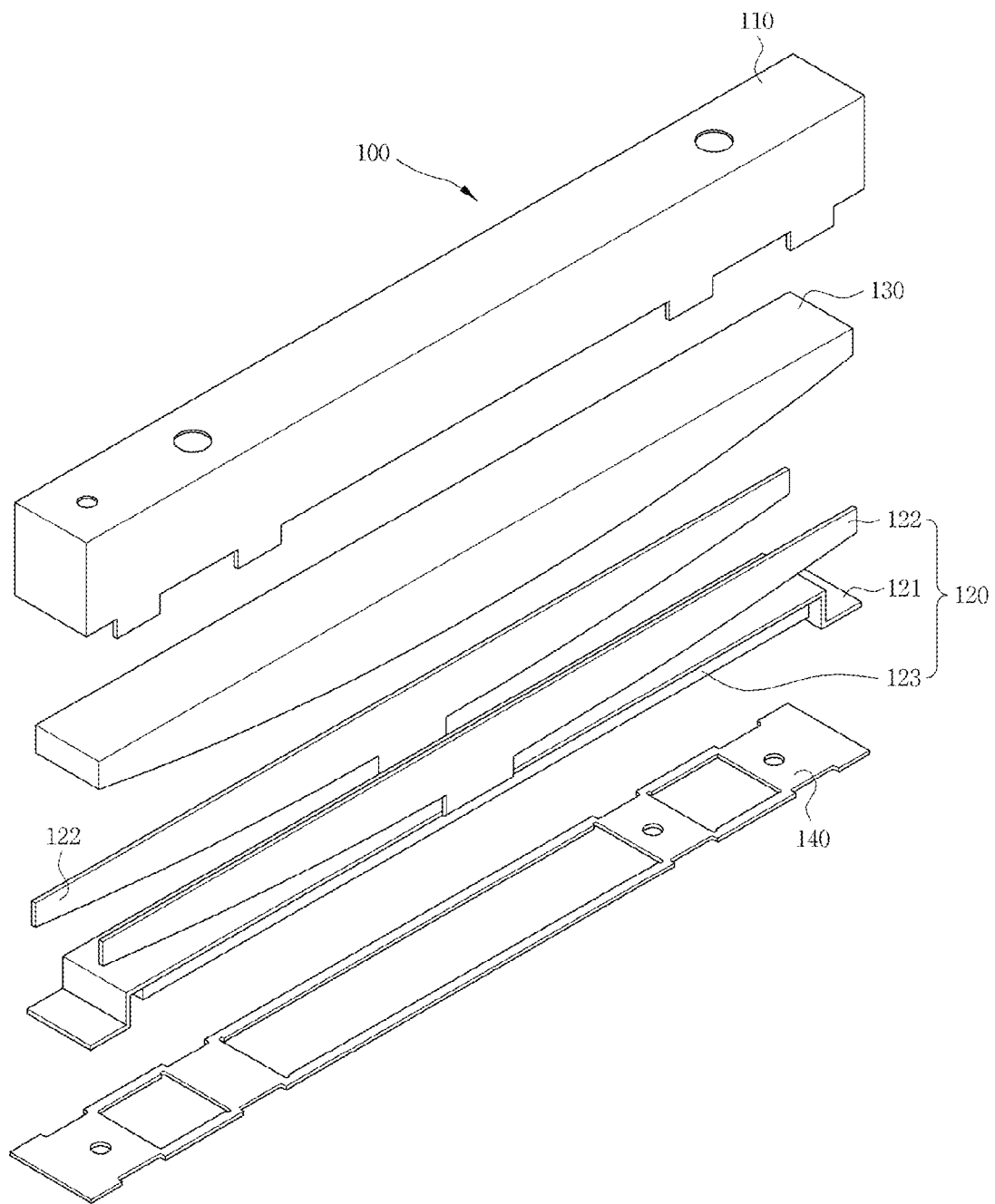
FIG. 2 is an exploded perspective view of the piezoelectric vibration module illustrated in FIG. 1.

FIG. 1 is a perspective view of a piezoelectric vibration module according to a first preferred embodiment of the present invention. FIG. 2 is an exploded perspective view of the piezoelectric vibration module illustrated in FIG. 1.

As illustrated in the figures, the piezoelectric vibration module 100 according to the first preferred embodiment of the present invention includes an upper case 110, a vibration plate 120, a weight body 130, and a lower case 140. The piezoelectric vibration module 100 is used as a means for transferring vibration force to a touch screen panel (not illustrated).

The upper case 110 has a box shape in which one surface is opened and receives a driving body, that is, the vibration plate 120 mounted with a piezoelectric element 123.

The vibration plate 120 transfers vibration force of the piezoelectric element 123 to external components through repetition of extension and shrinkage transformation integrally with the piezoelectric element 123 and includes a flat lower plate 121. The piezoelectric element 123 is mounted on one flat surface of the lower plate 121 and the weight body 130 is mounted or placed on the other surface of the lower plate 121. The vibration plate 120 may include a printed circuit board (PCB) (not illustrated) that applies power for driving the piezoelectric element 123.

Alternatively, the vibration plate 120 may include a pair of upper plates 122 that stand vertically upward on both sides of the lower plate 121 together with the flat lower plate 121 as described above. The upper plate 122 is coupled to the center of the lower plate 121. Each of the lower plate 121 and the upper plate 122 may be formed by a single integral component and may be fixedly coupled by various bonding methods unlike the above.

The vibration plate 120 is made of a metallic material having elastic force, for example, SUS to be transformed integrally with the piezoelectric element 123 which repeatedly extends or shrinks according to application of external power. When the vibration plate 120 and the piezoelectric element 123 are coupled to each other by the bonding coupling method, the vibration plate 120 may be made of invar which is a material having a similar thermal expansion coefficient as the piezoelectric element so as to prevent a bending phenomenon which may occur by hardening of a bonding member.

As described above, the vibration plate 120 is made of invar having the similar thermal expansion coefficient as the piezoelectric element 123, such that thermal stress is reduced, which is generated when the piezoelectric element 123 operates or is subjected to thermal shock even under a high-temperature external environment, thereby preventing a piezoelectric deterioration phenomenon in which an electric characteristic deteriorates.

The pair of upper plates 122 are arranged in parallel to each other as large as for example, the width of the lower plate 121, and as a result, the weight body 130 may be placed between the pair of upper plates 122. The weight body 130 as a medium that maximally increases vibration force is inclined upward toward both ends from the center of the weight body 130 in order to prevent contact with the lower plate 121 of the vibration plate 120. As described above, in a structure in which the vibration plate 120 includes the upper plate 122, since the weight body 130 does not contact the lower plate 121, the piezoelectric element 123 may be arranged on one flat surface of the lower plate 121.

For reference, the weight body 130 may be made of the metallic material and the weight body 130 is preferably made of a tungsten material having relatively high density in the same volume.

The lower case 140 is formed by a generally elongated planar plate. In this case, the lower case 140 has a size and a shape to close the opened bottom surface of the upper case 110.

The upper case 110 and the lower case 140 may be coupled to each other in various methods such as caulking, welding, and bonding which have already widely been known to those skilled in the art.

Figure 3:
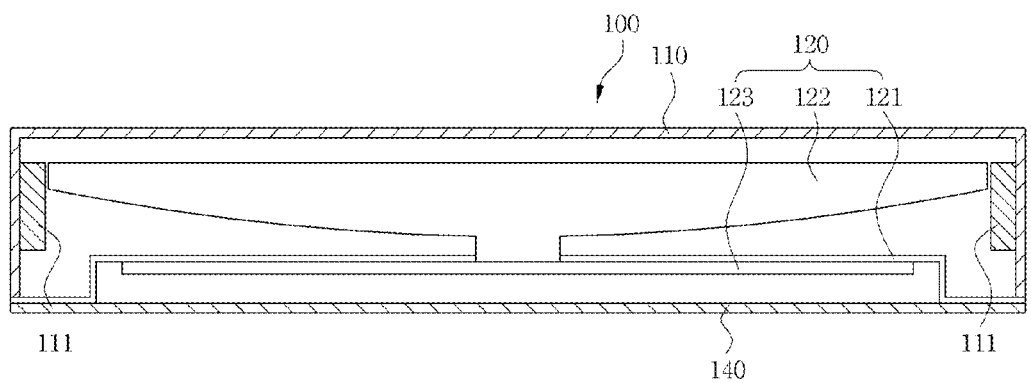
FIG. 3 is a cross-sectional view schematically illustrating the piezoelectric vibration module taken along line III-III of FIG. 1.

FIG. 3 is a cross-sectional view schematically illustrating the piezoelectric vibration module taken along line III-III of FIG. 1.

The vibration plate 120 is spaced apart from the lower case 140 in parallel with each other with a predetermined gap therebetween. Preferably, the lower plate 121 is coupled and fixed to both ends of the lower case 140 through steps formed at both ends thereof.

Unlike the above, the lower case 140 includes coupling ends (not illustrated) at both ends thereof and both ends of the flat lower plate 121 may be seated on the coupling end of the lower case 140.

As illustrated in the figure, the piezoelectric vibration module 100 according to the first preferred embodiment of the present invention includes a damper 111 on an inner surface of the upper case 110, in detail, an inner surface opposite to both ends of the vibration plate 120. Preferably, the damper 111 is formed integrally with the upper case 110. In this case, the damper 111 is not limited thereto and may be fixed by various coupling methods.

The damper 111 is made of the same material as the upper case 110 and is preferably made of a rigid material which is not almost elastically transformed due to a high elastic coefficient thereof. The damper 111 of the present invention is not limited thereto and may be made of a flexible material.

In particular, the damper 111 may prevent the piezoelectric element 123 from being damaged due to contact between both ends of the vibration plate 120 and the upper case 110 when the piezoelectric vibration module 100 is subjected to external shock, in particular, the longitudinal (horizontal) shock of the piezoelectric vibration module 100. To this end, the damper 111 protrudes toward the center on the inner surface of the upper case 110 in the same height as the vibration plate 120 to be placed in an internal space formed by the upper case 110 and the lower case 140.

The length of the vibration plate 120 should be shouter than a spaced distance between two dampers 111. That is, the damper 111 is spaced apart from both ends of the vibration plate 120 with a predetermined gap therebetween without directly contacting the vibration plate 120. Preferably, the spaced distance between the damper 111 and both ends of the vibration plate 120 is 1 mm or less.

When the horizontal shock is given, a longitudinal movement distance of the vibration plate 120 is reduced by the damper 111 to improve drop reliability by protecting the piezoelectric element 123.

When power is applied to the piezoelectric element 123, the piezoelectric element 123 is fully attached to the lower plate 121, such that a movement occurs at the center of the lower plate 121 through extension or shrinkage deformation. Since the movement occurs while the lower plate 121 is fixed to both ends of the lower case 140, the center of the vibration plate 120 is deformed vertically.

Moreover, the piezoelectric element 123 may be configured to be stacked in a single-layer type or a multi-layer type. The piezoelectric element stacked in the multi-layer type may ensure an electric field required to drive the piezoelectric element at lower external voltage. Therefore, driving voltage of the piezoelectric vibration module 100 according to the present invention may be lowered, and as a result, in the present invention, the piezoelectric element 123 stacked in the multi-layer type is preferably adopted.

As widely known to those skilled in the art, the piezoelectric element 123 may be made of various materials and particularly, made of polymer.

Figure 4A:
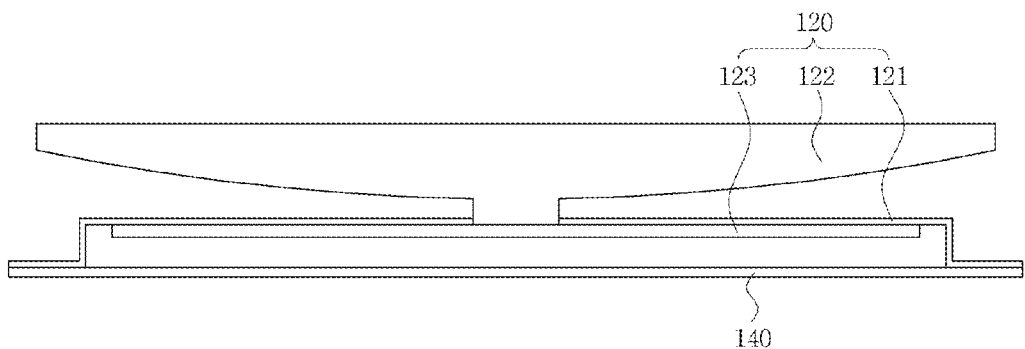
FIGS. 4A to 4C are diagrams illustrating a driving process of the piezoelectric vibration module illustrated in FIG. 3.
Figure 4B:
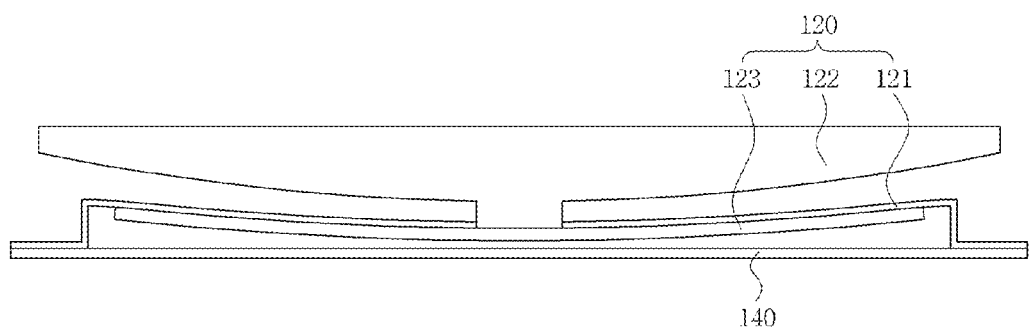
Figure 4C:
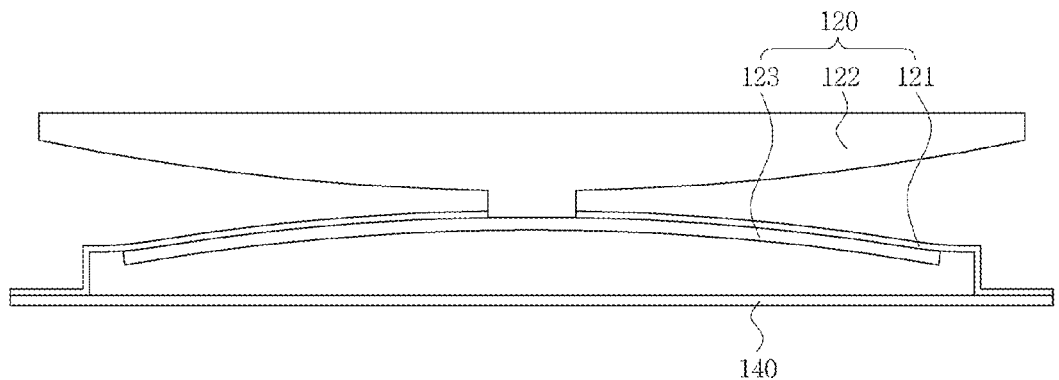

FIGS. 4A to 4C are diagrams illustrating a driving process of the piezoelectric vibration module 100 illustrated in FIG. 3. The piezoelectric vibration module 100 according to the first preferred embodiment of the present invention is coupled to an image display unit such as a touch screen panel or an LCD to transfer vibration force to the outside.

FIG. 4A is a cross-sectional view of the piezoelectric vibration module 100 illustrating a state before external power is applied. FIG. 4B is a cross-sectional view of the piezoelectric vibration module 100 in which the length of the piezoelectric element 123 is increased when power is applied. When the length of the piezoelectric element 123 increases, deformation rate of the lower plate 121 is relatively small and the lower plate 121 is fixed to the lower case 140, and as a result, the vibration plate 120 is bent and driven downward. Contrary to this, FIG. 4C is a cross-sectional view of the piezoelectric vibration module 100 in which the length of the piezoelectric element 123 is decreased when power is applied. When the length of the piezoelectric element 123 decreases, the lower plate 121 is bent and driven upward.

As illustrated in the figure, a user of a haptic device with the piezoelectric element 123 may sense vibration feedback by vertical vibration.

Figure 5:
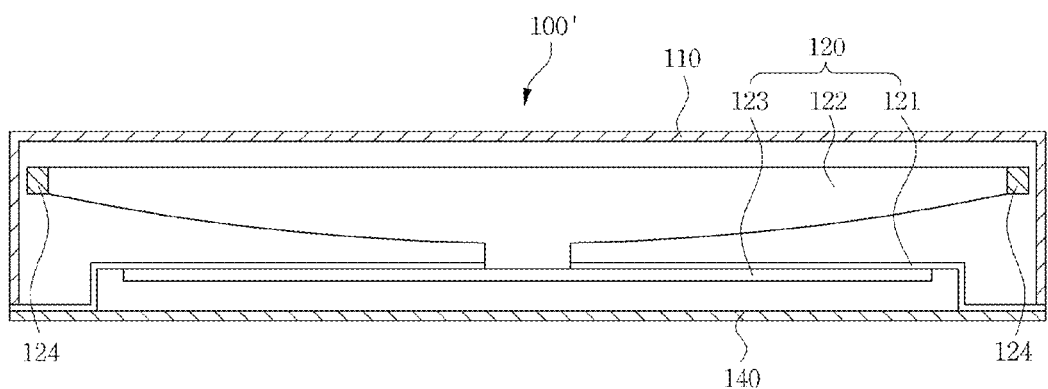
FIG. 5 is a cross-sectional view schematically illustrating a piezoelectric vibration module according to a second preferred embodiment of the present invention.

FIG. 5 is a cross-sectional view of a piezoelectric vibration module 100' according to a second preferred embodiment of the present invention. The piezoelectric vibration module 100' according to the second preferred embodiment of the present invention illustrated in FIG. 5 is similar as the piezoelectric vibration module 100 according to the first preferred embodiment of the present invention illustrated in FIG. 3 except for an arrangement state of the damper 111. Similar or the same constituent members will not be herein excluded in order to help clear understanding of the present invention.

As illustrated in FIG. 5, the piezoelectric vibration module 100' according to the second preferred embodiment of the present invention includes dampers 124 at both ends of the vibration plate 120. The damper 124 is formed integrally with the vibration plate 120. In this case, the damper 124 is not limited thereto, however, the damper 124 may be fixed by various coupling methods.

The damper 124 extends in the longitudinal direction at both ends of the vibration plate 120, in particular, the upper plate 122 and is made of the same material as the vibration plate 120. The damper 124 is made of a rigid material, and as a result, since the damper 124 has a high elastic coefficient, the damper 124 is made of a rigid material which is not almost elastically transformed. The damper 124 of the present invention may be made of a flexible material as necessary.

The length of the vibration plate 120 having the dampers 124 at both ends thereof is shorter than the longitudinal internal length of the upper case 110. Therefore, the upper case 110 and the damper 124 do not preferably directly contact each other. Particularly, a spaced distance between the damper 124 and the inner surface of the upper case 110 is 1 mm or less.

By this structure, the damper 124 may prevent impact force and a collision applied to the piezoelectric element 123 by reducing a spaced distance between the vibration plate 120 and the upper case 110 when the piezoelectric vibration module 100' of the present invention is subjected to external shock, in particular, the longitudinal (horizontal) shock of the piezoelectric vibration module 100'.

When the horizontal shock is given, the longitudinal movement distance of the vibration plate 120 is reduced to improve drop reliability by protecting the piezoelectric element 123.

Figure 6:
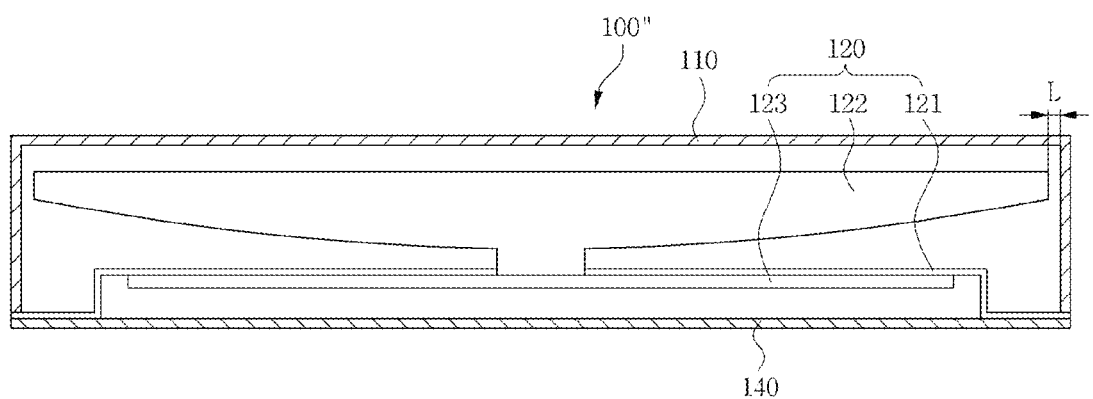
FIG. 6 is a cross-sectional view schematically illustrating a piezoelectric vibration module according to a third preferred embodiment of the present invention.

FIG. 6 is a cross-sectional view schematically illustrating a piezoelectric vibration module 100" according to a third preferred embodiment of the present invention. The similar or same constituent members as the piezoelectric vibration module 100 according to the first preferred embodiment of the present invention and the piezoelectric vibration module 100' according to the second exemplary embodiment of the present invention will not be described herein.

The piezoelectric vibration module 100" according to the third preferred embodiment of the present invention does not include the damper 111 (see FIG. 3) provided in the first preferred embodiment and the damper 124 (see FIG. 5) provided in the second preferred embodiment described above. In the piezoelectric vibration module 100" according to the third preferred embodiment of the present invention, both ends of the vibration plate 120 and the inner surface of the upper case 110 do not directly contact each other but are arranged to be spaced apart from each other with a predetermined gap therebetween.

In other words, the piezoelectric vibration module 100" according to the third preferred embodiment of the present invention provides a spaced distance L between the upper vibration plate 122, in particular, both ends of the upper plate 122 and the inner surface of the upper case 110 and the spaced distance L is 1 mm or less.

According to the preferred embodiments of the present invention, there is provided the piezoelectric vibration module that can certainly protect the driving body constituted by piezoelectric elements capable of providing vibration force from external shock.

In particular, a collision absorbing member such as a damper is provided at both ends of a vibration plate against a collision in the longitudinal direction of the piezoelectric vibration module, that is, a horizontal collision.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A piezoelectric vibration module, comprising:
a piezoelectric element generating vibration force through repetition of extension and shrinkage deformation by applying external power;
an upper case having a bottom surface opened and an inner space formed therein so that the piezoelectric element vibrates linearly, and dampers protruding toward the center on the inner surface are provided;
a lower case coupled to the bottom surface of the upper case and shielding the inner space of the upper case; and
a vibration plate including the piezoelectric element on a flat lower plate and placed in the upper case and the lower case and driven vertically,
wherein the vibration plate includes: the lower plate; a pair of upper plates that stand vertically upward at the centers of both sides of the lower plate; and a weight body placed between the pair of upper plates in order to increase the vibration force of the piezoelectric element.

2. The piezoelectric vibration module as set forth in claim 1, wherein the damper is installed at the same height as the vibration plate.

3. The piezoelectric vibration module as set forth in claim 1, wherein the length of the vibration plate extends shorter than a spaced distance between the dampers.

4. The piezoelectric vibration module as set forth in claim 1, wherein the damper is made of the same material as the upper case.

5. The piezoelectric vibration module as set forth in claim 1, wherein the damper is made of a rigid material.

6. The piezoelectric vibration module as set forth in claim 1, wherein a spaced distance between the damper and both ends of the vibration plate is 1 mm or less.

7. A piezoelectric vibration module, comprising:
a piezoelectric element generating vibration force through repetition of extension and shrinkage deformation by applying external power;
an upper case having a bottom surface opened and an inner space formed therein so that a piezoelectric element vibrates linearly;
a lower case coupled to the bottom surface of the upper case and shielding the inner space of the upper case; and
a vibration plate mounted with the piezoelectric element and dampers at both ends thereof and placed in the upper case and the lower case and driven vertically,
wherein the vibration plate includes: the lower plate mounted with the piezoelectric element; a pair of upper plates that stand vertically upward at the centers of both sides of the lower plate; and a weight body placed between the pair of upper plates in order to increase the vibration force of the piezoelectric element.

8. The piezoelectric vibration module as set forth in claim 7, wherein an internal length of the upper case is larger than the length of the vibration plate.

9. The piezoelectric vibration module as set forth in claim 7, wherein the dampers are made of the same material as the vibration plate.

10. The piezoelectric vibration module as set forth in claim 7, wherein the damper is made of a rigid material.

11. The piezoelectric vibration module as set forth in claim 7, wherein the dampers protrude outward at both ends of the upper plate.

12. The piezoelectric vibration module as set forth in claim 7, wherein a spaced distance between the damper and the inner surface of the upper case is 1 mm or less.

13. A piezoelectric vibration module, comprising:
a piezoelectric element generating vibration force through repetition of extension and shrinkage deformation by applying external power;
an upper case having a bottom surface opened and an inner space formed therein so that the piezoelectric element vibrates linearly;
a lower case coupled to the bottom surface of the upper case and shielding the inner space of the upper case; and
a vibration plate including a lower plate fixed on the lower case and mounted with the piezoelectric element and a pair of upper plates that stand vertically upward at the centers of both sides of the lower plate,
wherein both ends of the upper plate extend so as not to contact an inner surface of the upper case.

14. The piezoelectric vibration module as set forth in claim 13, wherein a spaced distance between both ends of the upper plate and the inner surface of the upper case is 1 mm or less.

15. The piezoelectric vibration module as set forth in claim 13, wherein the vibration plate further includes a weight body provided between the pair of upper plates in order to increase the vibration force of the piezoelectric element.

* * * * *